United States Patent [19]
Queen et al.

[11] Patent Number: 5,831,990
[45] Date of Patent: Nov. 3, 1998

[54] TEST-MODE CONTROL FOR DYNAMIC LOGIC GATES

[75] Inventors: William J. Queen; Russell W. Mason, both of Fort Collins, Colo.

[73] Assignee: Hewlett-Packard Company, Palo Alto, Calif.

[21] Appl. No.: 667,037

[22] Filed: Jun. 19, 1996

[51] Int. Cl.⁶ .................................................. G06F 11/00
[52] U.S. Cl. ........................................................ 371/22.1
[58] Field of Search ................................. 371/22.1, 22.5, 371/22.6, 21.4, 27.5, 28; 326/332, 21, 34; 364/498–490, 550, 551.01; 324/765, 658

[56] References Cited

U.S. PATENT DOCUMENTS

| | | | |
|---|---|---|---|
| 5,440,243 | 8/1995 | Lyon | 326/33 |
| 5,467,026 | 11/1995 | Arnold | 326/16 |
| 5,473,269 | 12/1995 | Dickinson | 326/93 |
| 5,550,487 | 8/1996 | Lyon | 326/33 |
| 5,557,620 | 9/1996 | Miller, Jr. et al. | 371/22.5 |

Primary Examiner—Robert W. Beausoliel, Jr.
Assistant Examiner—Nadeem Iqbal
Attorney, Agent, or Firm—Augustus W. Winfield

[57] ABSTRACT

A dynamic logic circuit having additional test circuitry and control, enabling the dynamic logic gate to operate normally during testing or alternatively to force the dynamic logic gate output to a known state during testing to provide a known input for downstream logic. With the additional test circuitry, there is no need for input test signal sequences to propagate logical test vectors to tested nodes. The dynamic logic circuit includes a storage node that is precharged during a precharge cycle and logic circuitry that may discharge the storage node during an evaluation cycle, depending on logic inputs. The logic circuitry discharges through a clock transistor. Additional test circuitry is added to discharge the storage node during the evaluation cycle, in response to a test control signal and a test state signal. When the dynamic logic gate is operating normally during testing, the test circuitry is disabled. When the gate output is to forced into a known state, the clock transistor is disabled, disabling the logic circuitry, and the test circuitry discharges the storage node, depending on the test state signal.

3 Claims, 3 Drawing Sheets

TEST-MODE CONTROL FOR DYNAMIC LOGIC GATES

FIELD OF INVENTION

This invention relates generally to integrated circuit testing and design for testability and more specifically to providing capability for controlling output states of dynamic logic gates during testing.

BACKGROUND OF THE INVENTION

During the manufacturing of digital integrated circuits, a manufacturing defect may result in a signal node being "stuck-at" a high or low level. Examples are unintentional resistive paths (called bridging faults) between different signal nodes, between a signal node and a power supply node, or between a signal node and ground. Other faults result in node voltages that differ from ideal logic levels that may not result in static logic errors but may degrade the dynamic performance of a circuit.

One common test approach is to apply sequences of logical input signals and monitor the resulting output signals. As complexity grows, however, it becomes increasingly difficult to find an input signal sequence that correctly exercises all internal nodes of interest and that guarantees that an internal node fault will propagate to an output for detection. In addition, a node defect may not be detectable as a logical fault. For example, as a result of a resistive or shorted node, circuitry may simultaneously pull-up and pull-down the node. The result of the conflicting conductances may be an intermediate voltage that may or may not induce logic errors.

Another common test approach is to measure changes in power supply current as nodes are exercised. For example, if a node is shorted to ground and a gate attached to the shorted node attempts to drive the shorted node to a supply voltage (or conversely, if a node is shorted to a supply voltage and a gate attempts to drive the shorted node to ground), the shorted node may cause a detectable increase in the current drawn by the integrated circuit. If the current change is detectable, the node fault may be detectable without having to propagate the fault to an output node. In addition, the node fault may be detectable even if no logical error is induced. Testing based on detecting an increase in power supply current is called quiescent current testing or IDDQ testing.

Still another approach to testing is to capture the logical state of internal nodes, or to force the logical state of internal nodes through special test circuitry. One standard approach is boundary scan testing. See, for example, IEEE Standard Test Access Port and Boundary-Scan Architecture (IEEE Std 1149.1–1990) available from the Institute of Electrical and Electronic Engineers, Inc., 345 East 47th Street, New York, N.Y. 10017. In boundary scan testing, many internal states are simultaneously captured into test registers (scan latches), and the captured data is then serially shifted (scanned) through an IC pin (Test Access Port, TAP) for external processing. Alternatively, latches and multiplexers, controllable from boundary scan latches, may be added at nodes so that selected node states are controllable from boundary scan latches.

Boundary scan testing requires scan latches. Large combinations of logic gates present special problems. In particular, for large combinations of dynamic gates, where each gate can have a large fan-in, there may be a large number of logical nodes that need to be detected or controlled. It is impractical to add scan latches for every node. Instead, there must be a trade-off between acceptable overhead (test) circuitry and suitable test coverage. There may also be area and speed trade-offs. For example, a series multiplexer for controlling a node state adds some inherent delay. Typically, some nodes are controlled and some downstream nodes depend on propagation of test vectors. There is a need for control of dynamic logic nodes, along with provision for observation of normal operation, with negligible impact on circuit speed, without requiring additional latches or multiplexers and without requiring rearrangement of logic.

SUMMARY OF THE INVENTION

Logic gates are modified to enable control or observation of logic gate outputs at arbitrary points in the logic network, with circuitry that is much less complex than latches, and with negligible impact on circuit speed. Control is provided within a logic gate rather than requiring a controllable state-element (latch) on the output of the gate. There is no need for input test signal sequences to propagate logical test vectors to tested nodes. Testing can take place at the normal operating speed of the logic network.

Modifications to a logic gate for testing comprise two additional transistors and a different signal to one clock input. There are two test control signals, TEST1 and TEST2. When TEST1 is high and TEST2 is low, the gate functions normally and the result of the normal logical evaluation of the inputs can be observed. When TEST1 is low and TEST2 is high, the normal logical evaluation circuitry is disabled and the gate output can be forced to a known logical state by test circuitry, providing a known logical state for downstream logic inputs.

DETAILED DESCRIPTION OF THE PREFERRED EMBODIMENT OF THE INVENTION

Figure 1:
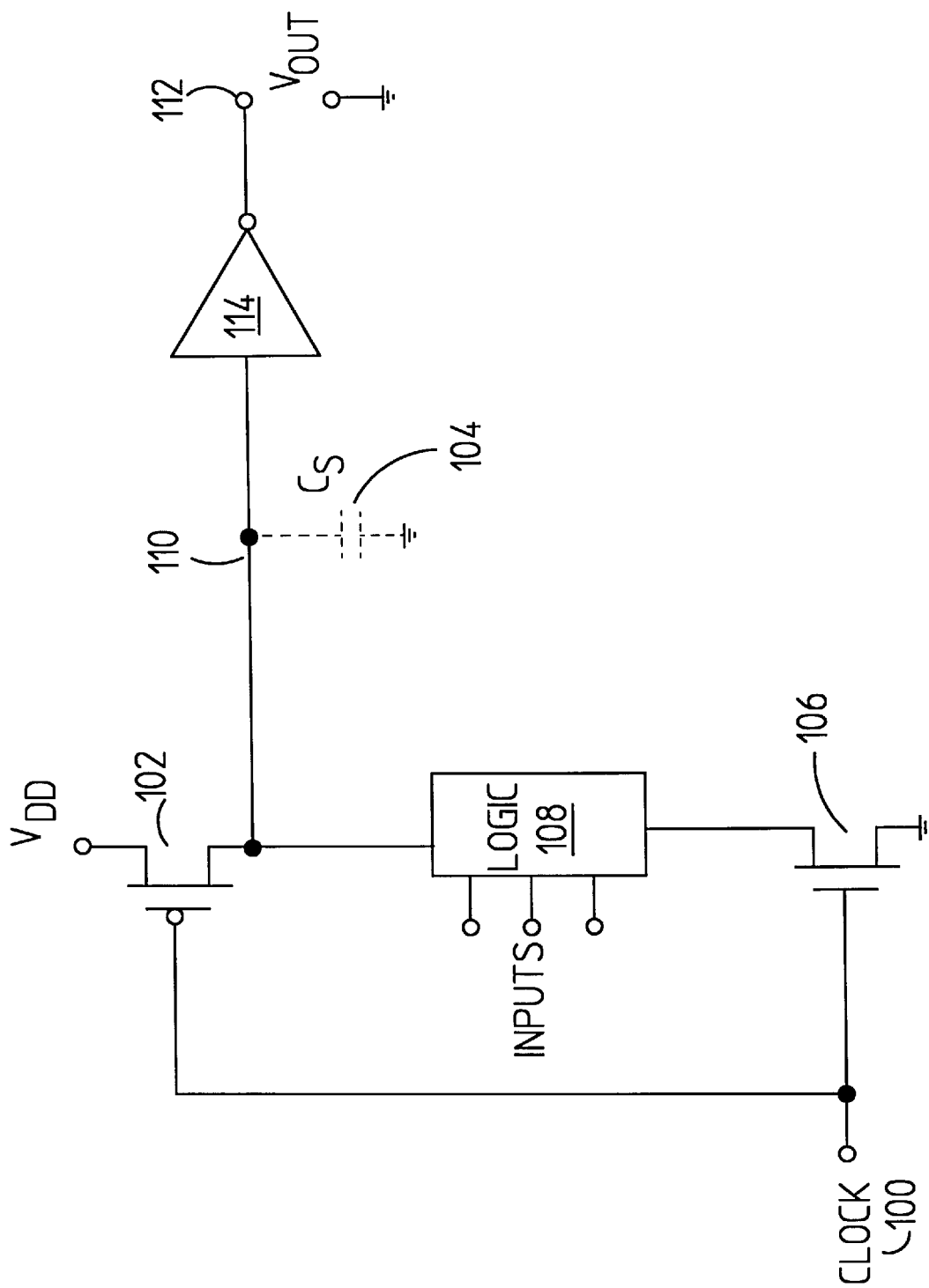
FIG. 1 is a simplified schematic of a domino dynamic logic gate.

FIG. 1 illustrates a simplified MOS domino dynamic logic gate. The term "domino" means that the gate has an inverting buffer (114) on the output. In FIG. 1, when clock 100 is low (precharge phase), transistor 102 charges the storage node capacitance 104 to the supply voltage $V_{DD}$. When clock 100 is high (evaluation phase), transistor 106 conditionally discharges the storage node capacitance 104 depending on the logical combinational state of logic circuitry 108.

Figure 2:
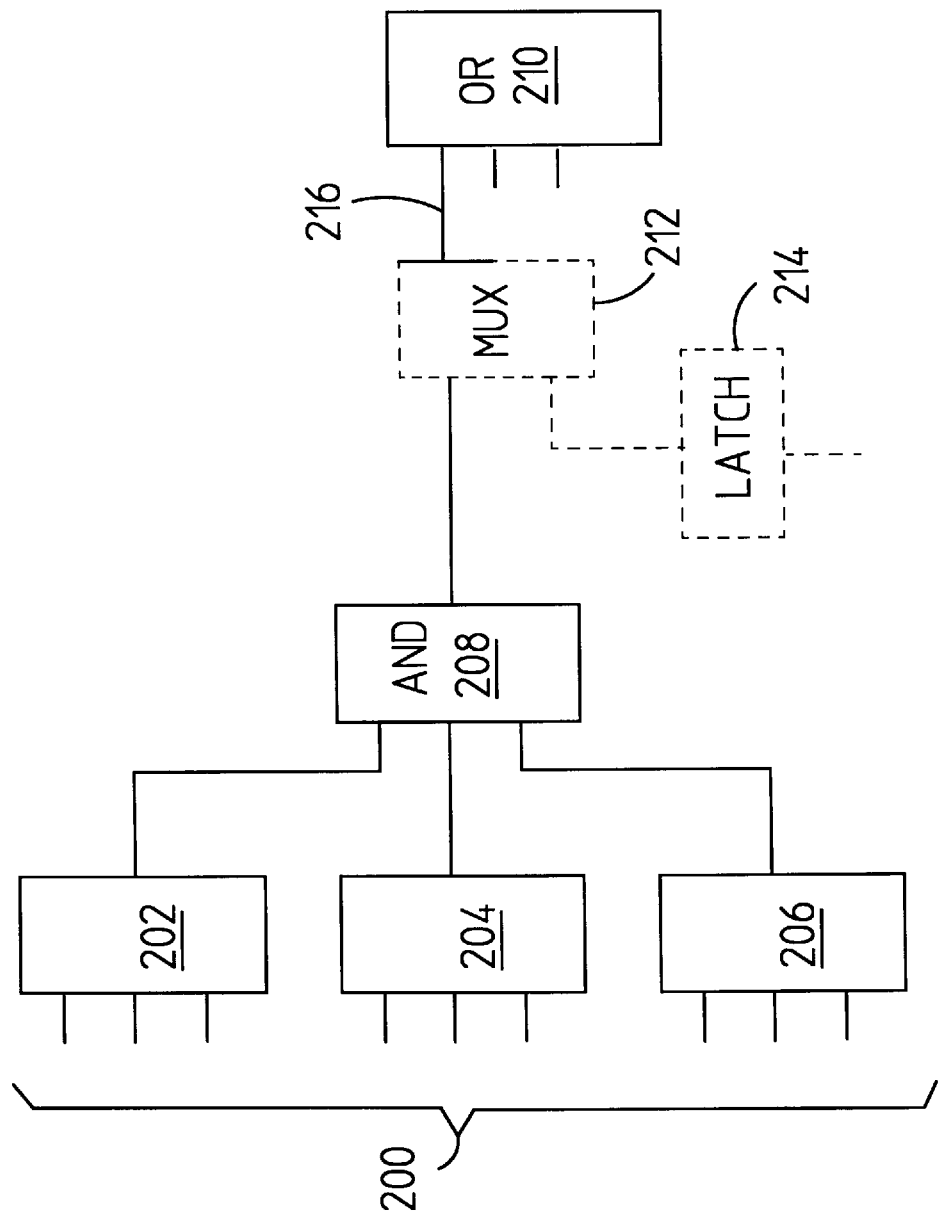
FIG. 2 is a logic diagram of cascaded domino logic gates.

FIG. 2 illustrates a network of cascaded domino logic gates. Typically, in order to test a complex combination of dynamic gates, external input signals 200 must be generated and propagated to internal logic circuitry in a manner that guarantees that for every storage node of interest, at some time during the testing period, the internal inputs to the logic circuitry corresponding to the node of interest are in a known state. For example, in order to test gate 210 for a storage node shorted to the power supply, external input signals 200 must be generated and propagated in a manner that guarantees that, at some time during the testing period, the inputs to the gate 210 will cause the node capacitance to be discharged. For cascaded gates, upstream gates can force downstream gates to always evaluate to logical TRUE (FIG. 1, logic 108) so that downstream storage nodes are forced low (FIG. 1, transistor 106). In FIG. 2, if gates 202, 204, and 206 can be guaranteed or forced to evaluate high (storage node discharged), then gates 208 and 210 can be guaranteed to evaluate high. In general, for a network of domino logic gates, if all the inputs 200 to the network can be forced high, then storage nodes in all downstream gates will be forced low indirectly.

In general, inputs 200 in FIG. 2 may be interior nodes of an integrated circuit so that there is no direct access to the inputs. In general, dynamic logic gates can have a very large fan-in, requiring control of a large number of inputs for testing, typically requiring a large number of test latches to hold test vectors for the inputs. In FIG. 2, instead of controlling every input 200 in order to test gate 210, it may be useful to instead directly force node 216 at the output of gate 208 to a known state, regardless of the inputs. One conventional approach is to add a multiplexer 212 with one input controllable from boundary scan latches. If the multiplexer output needs to remain stationary during shifting of boundary scan latches, an additional latch (latch 214) may be necessary. The multiplexer 212 may select the state of latch 214 in one test mode or may select the output of gate 208 for observation of gate 208 during a second test mode or for normal operation.

In contrast, a goal of the invention is to provide a capability to force the output of a gate (for example, the output of gate 208) to a known state during testing to generate known inputs for downstream logic and to permit the output of the gate to respond normally to a set of inputs during testing to test the normal functioning of the gate. The invention effectively moves control internally to the logic gates, with the dynamic logic gates inherently providing a latching function. Control of logic gate outputs is then provided at arbitrary points in the circuit path, with circuitry that is less complex than latches and multiplexers, and with negligible impact on circuit speed. There is no need for input test signal sequences to propagate logical test vectors to tested nodes.

Figure 3:
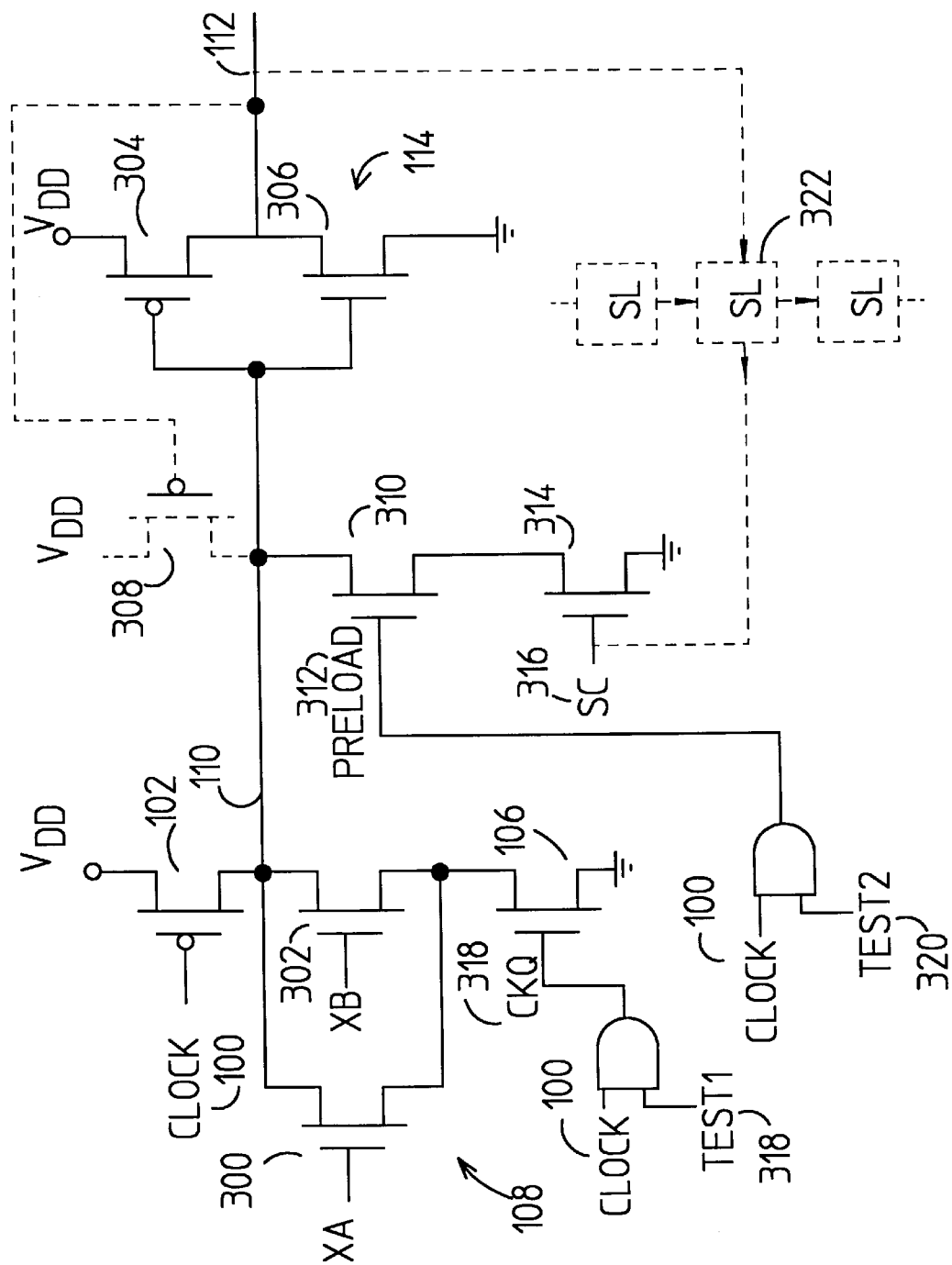
FIG. 3 is a schematic of the dynamic logic gate of FIG. 1 adapted for testing in accordance with the present invention.

FIG. 3 illustrates the domino logic gate of FIG. 1, with additional detail, and modifications for testing in accordance with the invention. Logic circuitry 108 (FIG. 1) is comprised of transistors 300 and 302 (FIG. 3). In FIG. 3, transistors 300 and 302 are connected in parallel to provide a logical OR function. If signal XA or signal XB are high during the evaluation phase, node 110 will be pulled low. A logical AND function may be provided by transistors connected in series. Inverter 114 (FIG. 1) is comprised of transistors 304 and 306 (FIG. 3). Transistor 310 along with signal PRELOAD (312), transistor 314 along with signal SC (316), the qualified clock signal CKQ (318), signals TEST1 (318) and TEST2 (320), and optional boundary scan latch 322 are all modifications to the circuit of FIG. 1 for testing, in accordance with the invention. Signals TEST1 (318), TEST2 (320), CKQ (318) and PRELOAD (312) are global signals used for many gates to be tested. The only incremental hardware local to the gate illustrated is transistors 310 and 314 (and scan latch 322 if present).

Qualified clock signal CKQ (318) in FIG. 3 is the logical AND of clock signal CLOCK (100) and a first test control signal TEST1 (318). If test control signal TEST1 (318) is high and test signal TEST2 (320) is low, CKQ (318) is functionally the same as CLOCK (100) as in FIG. 1, and node 110 is conditionally discharged during the evaluation phase by transistor 106, depending on logic 108. If test control signal TEST1 (318) is low, signal CKQ (318) is low, and transistor 106 is disabled. If test control signal TEST1 (318) is low and test signal TEST2 (320) is high, test control signal PRELOAD (312) is high during the evaluation phase, and node 110 is conditionally discharged during the evaluation phase by transistor 314, depending on test state signal SC (316). In summary, if signal TEST1 (318) is high and signal TEST2 (320) is low, the normal logical function of the gate may be tested. If signal TEST1 (318) is low and signal TEST2 (320) is high, logic 108 has no effect and output 112 may be forced to a known state by signal SC (316), providing a known input to downstream logic.

Test state signal SC (316) may be tied to a fixed logical state ($V_{DD}$ or ground), may be a binary signal controlled externally or internally, or may be controlled by a boundary scan latch (322). If boundary scan is implemented, a boundary scan latch 322 may be used to observe the normal operation of gate output 112 in response to inputs XA and XB, or to control the gate output 112 via test state signal SC (316). In general, it is desirable for output 112 to remain stationary during shifting of the boundary scan latches. Therefore, signal PRELOAD (312) is preferably a short pulse. If PRELOAD (312) is a pulse, and signal SC (316) is being provided from a boundary scan latch 322, then the boundary scan latches can shift immediately after the gate has responded to the signal SC, without affecting output 112.

Transistor 308 is optional and provides no logical function. During testing, the clock 100 may be paused for extended periods of time. With the clock 100 paused, node 110 may be floating high or floating low. If node 110 is floating low, leakage current from transistor 102 may cause node 110 to drift high. Similarly, if node 110 is floating high, leakage current from transistors 300, 302, or 310 may cause node 110 to drift low. Transistor 308, if present, is typically much smaller than the other transistors, and is added to ensure that node 110 does not drift low when floating high. If necessary, a small N-type transistor from node 110 to ground, with the gate connected to output 112, may be provided to prevent node 110 from drifting high when floating low.

In general, transistors 310 and 314 (FIG. 3) are not needed for every gate. If the inputs to a particular gate are indirectly controllable during the evaluation phase, test circuitry may not necessary for that particular gate. For example, for domino logic as illustrated by the example in FIG. 2, additional transistors may be required only on gates 202, 204, and 206 and only if inputs to these gates cannot be forced high. Alternatively, assume for example in FIG. 3 that signal XA goes to 64 gates and that signal XB goes to 64 gates. Rather than providing transistors 310 and 314 on all 64 gates that receive signals XA and XB, it is more efficient to provide transistors 310 and 314 only on the 2 gates generating signals XA and XB.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of testing a dynamic logic gate, the dynamic logic gate having a storage node that is precharged during a precharge phase, the method comprising the following steps:

connecting test circuitry to the storage node;

disabling logic circuitry connected to the storage node, during an evaluation phase, thereby ensuring that only the test circuitry can discharge the storage node;

asserting a test control signal, to the test circuitry, during the evaluation phase;

asserting a test state signal, to the test circuitry, during the evaluation phase; and discharging the storage node, through the test circuitry, during the evaluation phase, in response to the test control signal and the test state signal, depending on a state of the test state signal.

2. A dynamic logic gate, the logic gate comprising:

a storage node that is precharged during a precharge phase;

logic circuitry connected to the storage node, the logic circuitry adapted to discharge the storage node during an evaluation phase depending on inputs to the logic circuitry;

first test circuitry connected to the storage node, the first test circuitry receiving a test control signal and a test state signal, the first test circuitry adapted to discharge the storage node during the evaluation phase in response to the test control signal and the test state signal;

logic circuitry connected to a power supply potential through a clock transistor; and second test circuitry, connected to the clock transistor, receiving a second test control signal, the second test circuitry turning the clock transistor off in response to the second test control signal, thereby ensuring that only the first test circuitry can discharge the storage node during the evaluation phase.

3. The dynamic logic gate of claim 2, the first test circuitry further comprising:

a first transistor connected to the storage node, the first transistor receiving the test control signal; and a second transistor connected in series between the first transistor and a power supply potential, the second transistor receiving the test state signal.

* * * * *